United States Patent
Hubert et al.

(10) Patent No.: US 9,634,225 B2
(45) Date of Patent: Apr. 25, 2017

(54) ARTIFICIAL MUSCLE CAMERA LENS ACTUATOR

(71) Applicant: Apple Inc., Cupertino, CA (US)

(72) Inventors: Aurelien R. Hubert, Saratoga, CA (US); Douglas S. Brodie, Palo Alto, CA (US); Iain A. McAllister, Campbell, CA (US); Jeffrey N. Gleason, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 89 days.

(21) Appl. No.: 13/971,077

(22) Filed: Aug. 20, 2013

(65) Prior Publication Data

US 2014/0168799 A1 Jun. 19, 2014

Related U.S. Application Data

(60) Provisional application No. 61/738,312, filed on Dec. 17, 2012.

(51) Int. Cl.
*G02B 7/02* (2006.01)
*H01L 41/047* (2006.01)
(Continued)

(52) U.S. Cl.
CPC ............ *H01L 41/047* (2013.01); *G02B 7/09* (2013.01); *G03B 3/10* (2013.01); *G03B 5/00* (2013.01);
(Continued)

(58) Field of Classification Search
USPC ......... 359/811, 813, 815, 819, 821–824, 826
See application file for complete search history.

(56) References Cited

U.S. PATENT DOCUMENTS 7,585,122 B2 9/2009 Eromaki
7,948,693 B2 * 5/2011 Chang .......................... 359/811
(Continued)

FOREIGN PATENT DOCUMENTS

| JP | 2007093755 A | 4/2007 |
| JP | 2007094237 A | 4/2007 |
| JP | 2010159780 A | 7/2010 |

OTHER PUBLICATIONS

EAMEX, Product—1. Adjustable aperture for cellular phone camera, Internet document at: http://www.eamex.co.jp/product_e.html#ap, (14 pages).

(Continued)

*Primary Examiner* — Joseph P Martinez
*Assistant Examiner* — Brandi Thomas
(74) *Attorney, Agent, or Firm* — Blakely, Sokoloff, Taylor & Zafman LLP (57) ABSTRACT

An artificial muscle structure has an electro-active polymer (EAP) layer having a frusto-conical shape and whose tip has an opening formed therein for use as a camera variable aperture. First, second and third electrode segments are formed on a rear face of the EAP layer. The second segment is positioned in a gap between the first and third segments so as to be electrically isolated from the first and third segments. The second segment has an opening formed therein that is aligned with the opening in the EAP layer. A complementary electrode is formed on a front face of the EAP layer. Other embodiments are also described.

18 Claims, 5 Drawing Sheets

(51) Int. Cl.
*G02B 7/09* (2006.01)
*H01L 41/193* (2006.01)
*G03B 3/10* (2006.01)
*G03B 5/00* (2006.01)

(52) U.S. Cl.
CPC .... *H01L 41/193* (2013.01); *G03B 2205/0084* (2013.01)

(56) References Cited

U.S. PATENT DOCUMENTS

| | | |
|---|---|---|
| 7,982,982 B2 * | 7/2011 | Lee et al. ...................... 359/824 |
| 8,054,566 B2 | 11/2011 | Heim et al. |
| 8,164,835 B2 | 4/2012 | Heim et al. |
| 2006/0028743 A1 | 2/2006 | Yamashita et al. |
| 2007/0057230 A1 * | 3/2007 | Suzuki .................. G02B 1/105 |
| | | 252/299.63 |
| 2009/0147377 A1 * | 6/2009 | Polyakov et al. ............ 359/694 |
| 2010/0041721 A1 | 2/2010 | Miller |
| 2012/0075519 A1 | 3/2012 | Blasch |

OTHER PUBLICATIONS

PCT International Search Report and Written Opinion (dated Jun. 20, 2014), International Application No. PCT/US2013/071322, International Filing Date—Nov. 21, 2013, (13 pages).
PCT International Preliminary Report on Patentability and Written Opinion (dated Jul. 2, 2015), International Application No. PCT/US2013/071322, International Filing Date—Nov. 21, 2013, (8 pages).

* cited by examiner

ARTIFICIAL MUSCLE CAMERA LENS ACTUATOR

This application claims the benefit of the earlier filing date of U.S. Provisional Patent Application No. 61/738,312, filed Dec. 17, 2012.

An embodiment of the invention relates to an actuator for a moveable camera lens that may be integrated within a consumer electronics device. Other embodiments are also described.

BACKGROUND

Camera modules have been incorporated in a variety of consumer electronics devices, such as smart phones, mobile audio players, personal digital assistants, and desktop personal computers. A typical digital camera module is an assembly in which at least the following components may be integrated: a microelectronic image sensor chip, a printed circuit carrier such as a flexible circuit structure which forms power and signal connections between the chip and other circuitry inside the device, and an optical system including an aperture and a fixed focal length lens or an auto focus lens subsystem, and perhaps an optical zoom lens. The typical autofocus lens subsystem has a voice coil motor (VCM) actuator that is connected to move the lens barrel along the imaging axis.

There have been suggestions to use artificial muscle technology for implementing a camera autofocus lens actuator. Artificial muscle technology is based on electro-active polymer (EAP) materials, and may now be engineered and developed to for high volume manufacture. The material is available in plain flat film factor, and could be found used in some particular markets, for instance user-interface feedback such as vibration effect in consoles and video games. There have been attempts to create a new form of micro electro mechanical system (MEMS) actuator device using artificial muscle, in an autofocus lens actuator to provide lens displacement, but a completely engineered solution for high volume manufacture or mass production may not be available.

SUMMARY

An embodiment of the invention described here is an artificial muscle or EAP actuator that provides both lens displacement control and a variable aperture, for use with moveable camera imaging optics. An electrode arrangement is formed in an artificial muscle or EAP structure that may achieve both camera imaging axis optics displacement ("actuation") and variable aperture functions. In one embodiment, an EAP structure has a generally frusto-conical shape and is secured at its base to a base frame. A tip region of the EAP structure has an opening formed therein. The EAP structure is attached to a lens holder so that the opening is aligned with a face of the lens. The EAP structure has a first electrode portion attached to a face of an EAP layer and extends in a generally longitudinal direction, covering a side of the EAP structure. A second electrode portion also formed on the face of the EAP layer is isolated from the first electrode portion and covers the tip region. The second electrode portion has an opening that is aligned with the opening in the EAP structure.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Embodiments of the invention will now be described with reference to the drawings summarized below. The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions, and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
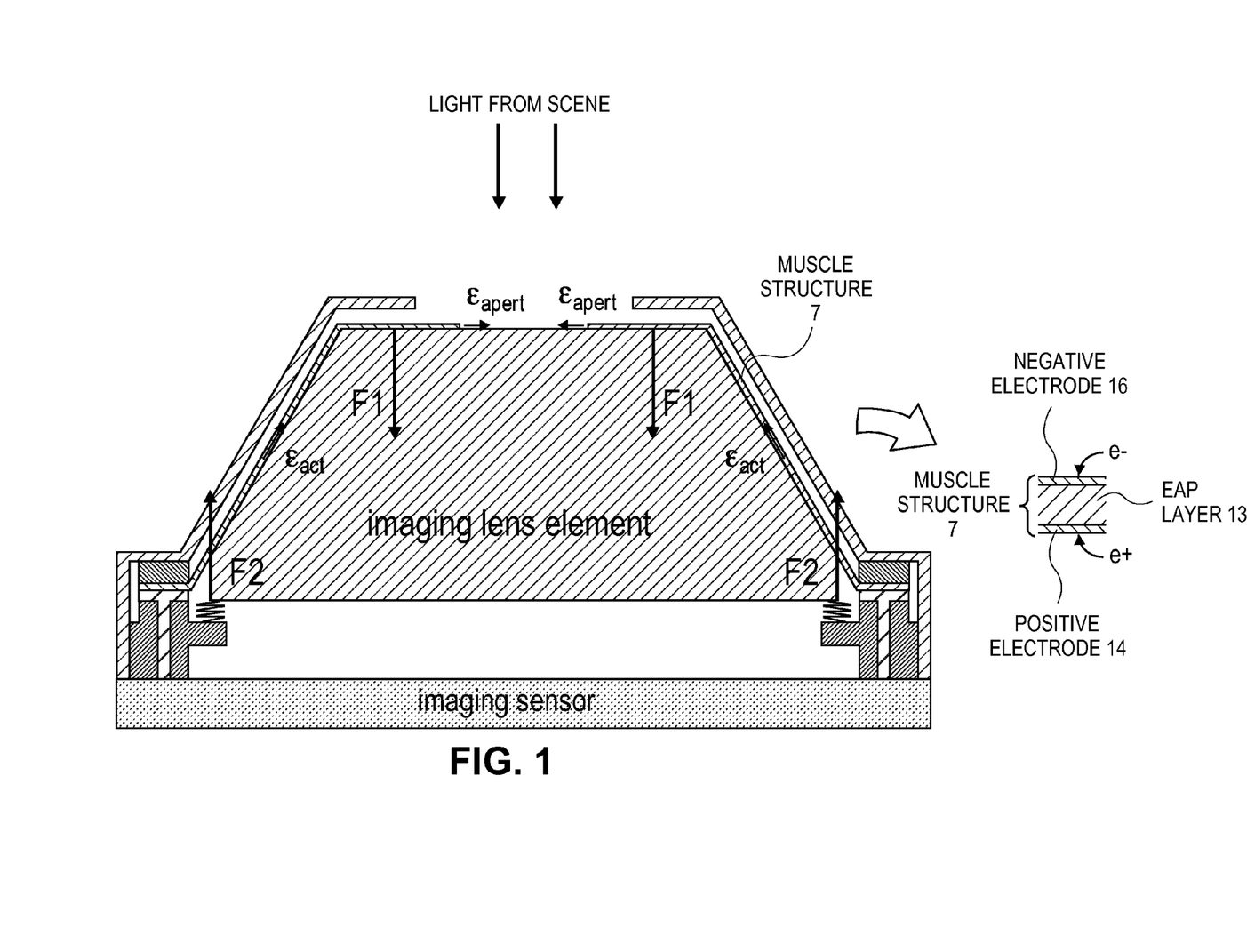
FIG. 1 shows a cut away or cross section view of part of an example artificial muscle based actuator for moveable camera optics according to an embodiment of the invention.

Referring to FIG. 1, an embodiment of the invention is shown here as an artificial muscle (EAP) actuator that achieves lens displacement as well as variable aperture. The actuator may be part of an autofocus lens subsystem, for example. The details of the actuator including the shape of its artificial muscle structure and an arrangement of its electrodes, which enable both actuation (or displacement) and variable aperture, are presented in FIGS. 2-5.

As seen in FIG. 1, a force F1 may be produced by the a muscle structure 7 deforming in response to a potential difference being created upon the structure's electrode arrangement, where F1 may be substantially along the imaging axis (in this example in a rearward direction). The potential difference that is created on opposing surfaces or faces of the muscle structure 7 is depicted by e+, e− on positive electrode 14 and negative electrode 16, respectively. These electrodes are formed on the opposing faces of an artificial muscle or EAP layer 13. Note that the labels "+" or "positive", and "−" or "negative" are used here only to indicate that there is a potential difference on a pair of "complementary" electrodes 14, 16, relative to each other; the labels are not meant to restrict the actual polarity of the voltages on the electrodes 14, 16. For example, the actual voltage on electrode 14 can be zero while that of its complementary electrode 16 is negative; alternatively, the voltage on electrode 16 can be zero while that of electrode 14 may be positive or negative. It is the potential difference between the electrodes 14, 16 that is relevant to the discussion here.

An opposing force F2 is produced by a spring 4 that acts upon a lens holder (e.g., lens barrel) 8 to which the imaging lens element may be rigidly fixed. The force F2 may be overcome by the force F1 produced by the muscle structure 7 acting upon the lens holder 8 in the reverse direction, by virtue of the muscle structure 7 being attached to the holder 8. In this manner, the holder 8 can be moved forward and backward as desired. An electrode arrangement is formed on the artificial muscle layer 13 that may achieve both camera lens displacement actuation (through strain $\epsilon_{act}$ and forces F1, F2) and variable aperture functions (strains $\epsilon_{act}$, $\epsilon_{apert}$).

The artificial muscle structure 7 has an EAP layer 13 that may be a single piece of EAP material extending from its base to its tip. The EAP layer 13 may be composed of one or more sandwiched layers of polymer material (e.g., silicon-based), and reacts to a differential of potential between two opposing, flexible electrodes 14, 16 that cover opposing faces of the EAP layer 13. This potential differential creates a sufficient electric field that activates the conductive particles of the polymer material, and creates a significant amount of force through the material that results in elongation. For example, the structure 7 may strain along its length proportionally to the square of the voltage input. The strain is used here for at least two different purposes. For actuation or displacement, it can move a lens or other optics forward and backward (or up and down) along the imaging axis of the lens. This may yield significant cost reduction versus a VCM actuator; the artificial muscle structure 7 may support large optics with improved system integration due to its generally frusto-conical shape; and it may exhibit extremely low power consumption.

To obtain a variable aperture element, a strain $\epsilon_{apert}$ is created in the tip region of the frusto-conically shaped EAP layer 13 that can change the size (e.g., diameter) of an opening 10 defined in the tip region. This arrangement can support smaller F# increments, and it can support relatively large aperture diameters thereby yielding a camera that has fast optics and better low light performance.

Figure 2:
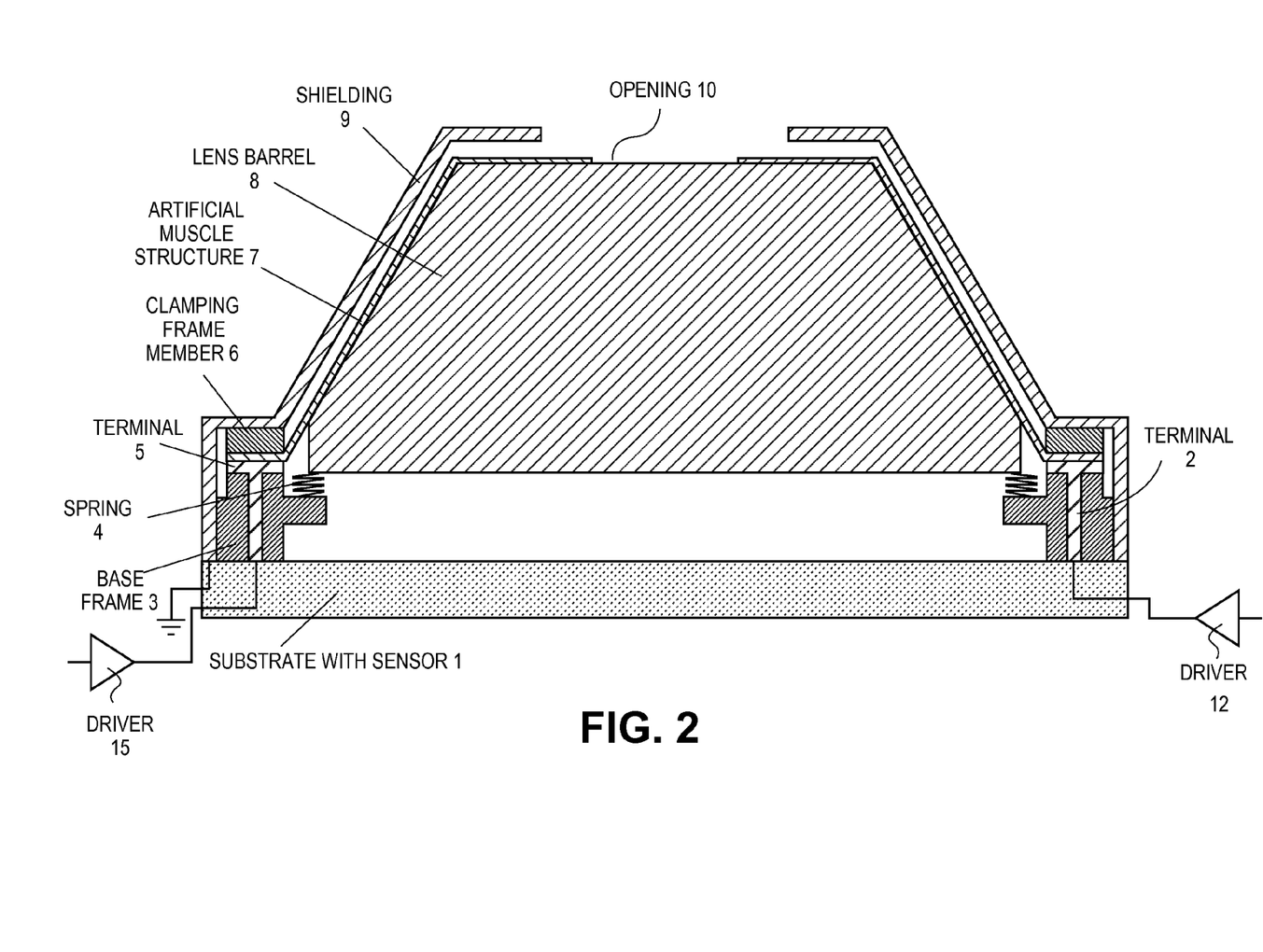
FIG. 2 is the cutaway view of FIG. 1 with the various components of the actuator being labeled.

Referring now to FIG. 2, the actuator may be integrated into a camera module that has a substrate 1 (e.g., a printed circuit carrier such as a flex circuit) on the front face of which is an active pixel area of an electronic imaging sensor. A base frame 3 having a central opening therein that allows light from a scene to reach the active pixel area of the imaging sensor may be attached to the front face. The base frame 3 may be made of an electric insulator material such as plastic. If the base frame can be made of a sufficiently clear light transparent material, then the physical central opening shown in the example of FIG. 2 may not be needed.

At least two terminals 5, 2 are formed along the base frame 3, to independently raise the potentials of two segments of the positive electrode 14. The terminal 5 on the left may be viewed as connected to an actuation segment 14a, while the terminal 2 on the right may be viewed as connected to an aperture segment 14c. The two terminals 5, 2 may be driven by separately controllable driver circuits 15, 12 which produce sufficient voltage needed for causing the desired deformation of the muscle structure 7. Each terminal may be electrically connected to a respective driver circuit through conductive traces or routes in the substrate 1.

The lens holder 8 carries the imaging optics (e.g., a lens system). The artificial muscle structure 7 may be attached on its rear face to the front face of the lens holder 8 as shown although other ways of attaching the muscle structure 7 to the lens holder 8 are possible, so long as the tip of the structure 7 can behave as a variable aperture that may be centered with the imaging axis while the structure 7 is able to actuate or displace the lens holder 8 along the imaging axis. A spring loading mechanism (e.g., spring 4) may be provided between the base frame 3 and the holder 8, to push against the base frame and, in this example, force the holder 8 to the forward or up direction. An annular clamping frame member 6 may be used to press the near end of the artificial muscle structure 7 against the base frame 3, to keep the near end fixed. At a far end (or tip) of the artificial muscle structure 7, there is an opening in the muscle structure that serves as the variable aperture and faces the imaging lens. A shielding structure 9 is formed over the front face of the muscle structure 7, which may be for purposes of shielding against electromagnetic interference; the shielding structure may be electrically grounded (through a contact on the substrate 1 as shown).

Referring back to FIG. 1, the muscle structure 7 is activated (deforms) when and in response to a sufficient electric field being created through and across the artificial muscle layer 13, due to sufficient voltage being applied to the complementary electrodes 14, 16 (formed on opposite faces of the muscle layer 13). These so-called positive and negative electrodes may be screen-printed onto the rear and front surfaces, respectively, of a layer or film or EAP material, in such a way that the positive and negative electrodes substantially overlap each other to increase the electric field strength that is created between them.

To combine actuation (displacement) and variable aperture functionality, the positive electrode 14 is divided into actuation portions or segments 14a, 14b that are separated (electrically isolated) from an aperture portion or segment 14c. This can be seen in FIG. 3A and FIG. 3B which depict several views of an example muscle structure 7. In this case, the muscle structure 7 is frusto-conical (having substantially or generally a frustum shape), and as seen in FIG. 2 its base or near end is attached to the base frame 3 (e.g., via a clamping mechanism). The tip of the frusto-conical structure (or frustum) has a central, in this case generally circular opening 10 that serves as the variable aperture of a camera imaging system. Although not visible in FIG. 3A and FIG. 3B, an opening 10 is also formed in the tip of the artificial muscle layer 13 that is aligned with the associated openings 10 in the positive electrode 14 and negative electrode 16. In this example, as best seen in the bottom view in FIG. 3A, the positive electrode 14 has two actuation segments 14a, 14a, each segment covering a little less than one half of the entire side surface area of the frustum. There is a gap between the two segments 14a, 14b that extends from one edge of the base, up to the tip and then down to an opposite edge of the base, as shown in the bottom view in FIG. 3A. In that gap lies the aperture portion or segment 14c, which in this case is composed of a single contiguous piece of electrode material. The gap between the actuation segments 14a, 14b is large enough to allow the aperture segment 14c to be positioned therebetween, such that segment 14c is isolated from both of the segments 14a, 14b. The variable aperture functionality described below may be controlled primarily by changing the potential on the aperture segment 14c relative to the negative electrode 16, independently of the potentials on the actuation segments 14a, 14b. In contrast, the variable displacement functionality may be controlled primarily by changing the potentials on the actuation segments 14a, 14b (relative to the negative electrode 16).

Figure 3A:
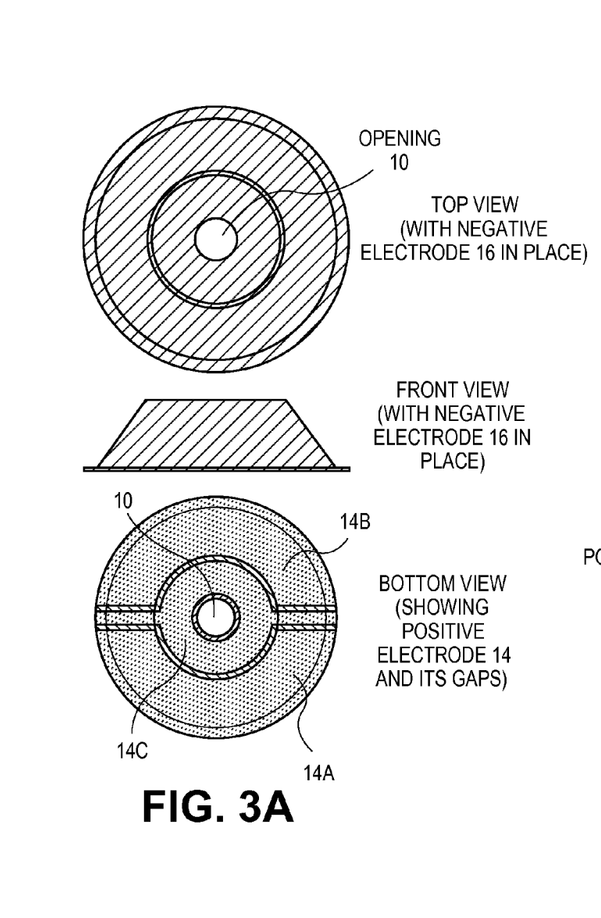
FIG. 3A contains bottom, front and top views of an example artificial muscle structure, with the positive and negative electrodes in place.
Figure 3B:
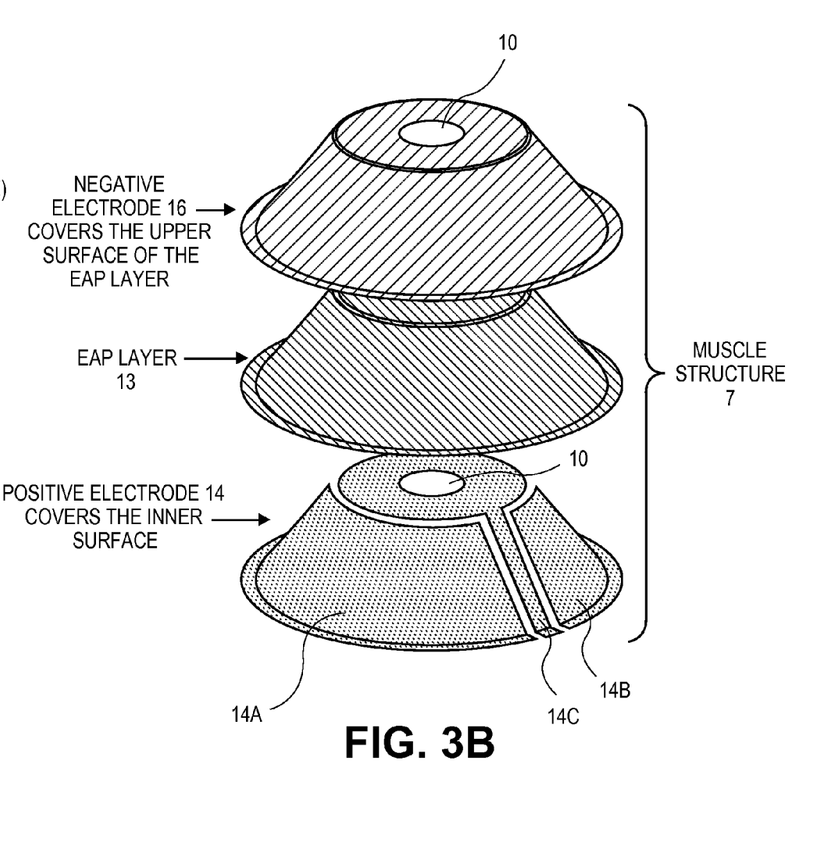
FIG. 3B is an exploded perspective view of the example artificial muscle structure, with the positive and negative electrodes and the artificial muscle shown separated from each other.

In this example, the aperture segment 14c has two arms that extend down from the tip of the frustum on opposite sides, to opposing edges of the base of the frustum. As also seen in the exploded view of FIG. 3B, the aperture segment 14c covers essentially the entire surface area of the tip, and has the central opening 10 therein that serves as the variable aperture. At the same time, the actuation segments 14a, 14b are essentially identical and there are only two actuation segments 14a, 14b each spanning a little less than 180 degrees of the full 360 degrees of the frustum. Note however that the arrangement shown in FIGS. 3A-3B is just one example of how the positive electrode 14 can be segmented into actuation and aperture portions (which are formed on the inner or rear face of a frusto-conical muscle layer 13); other electrode patterns are possible, including a mirror image of those shown in FIGS. 3A-3B, where the aperture and actuation segments are formed in the negative electrode 16 (rather than the positive electrode 14). As another example of an arrangement for segmenting the positive electrode 14, there can be three substantially identical actuation segments 14a, 14b and 14d (not shown) each spanning a little less than 120 degrees of the full 360 degrees of the frustum. The three actuation segments 14a, 14b, 14d could be driven at different levels of voltage, so as to for example make tilt corrections upon the lens holder 8.

Figure 4:
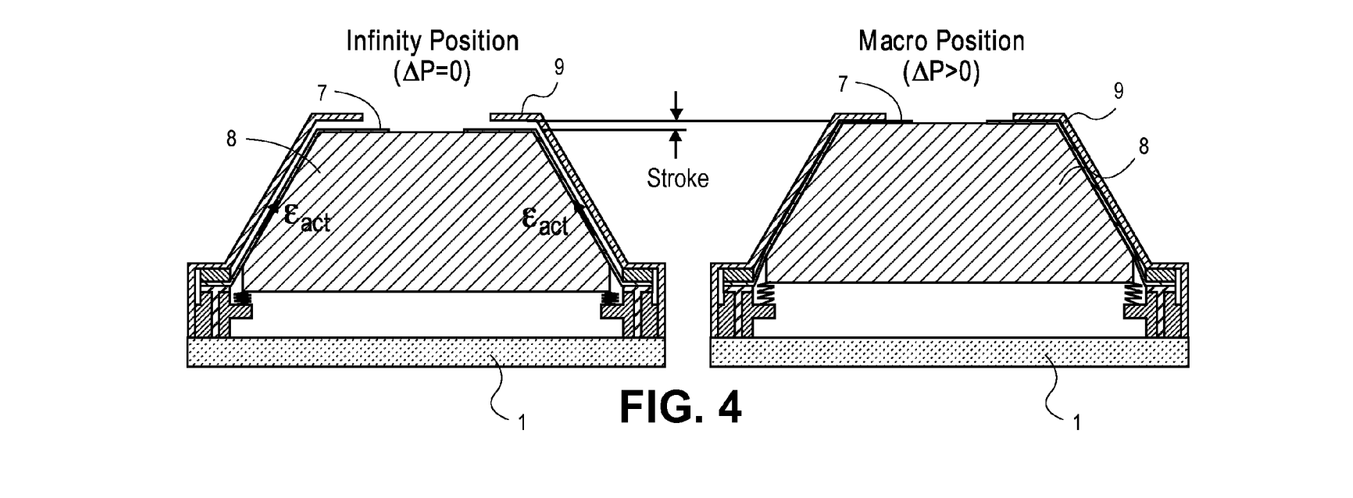
FIG. 4 shows cutaway views of the example actuator in macro and infinity lens positions.

Turning now to FIG. 4, these cutaway views depict the infinity and macro lens positions that can be obtained from the actuator, in one example. In this case, the artificial muscle structure 7 is under pre-tension (material elasticity in the side surface of the frustum in the longitudinal direction or along a length direction of the frustum), when it is not active, i.e. the potential difference between the actuation electrode segments 14a, 14b and the negative electrode 16 is small, e.g. ΔP=0. In this state, this pre-tension is compressing the spring 4 (spring loading) and the lens holder 8 is in its "infinity" focus position. Now, when the potential difference ΔP has been increased sufficiently, i.e. ΔP>0, the pre-tension of the muscle structure 7 releases, thereby allowing the lens holder 8 to be pushed up under spring loading into a "macro" focus position.

The shielding 9, which is electrically connected to the ground to provide some immunity from electromagnetic interference, in this example also plays the role of a hard stop, in this case defining the maximum actuator stroke possible. In one embodiment, to enable displacement of conventional camera optics (such as an autofocus lens), the driver circuits 15, 12 may need to deliver a ΔP of around 500V to 1000V to the electrodes. In one embodiment, the negative electrode 16 of the actuator is also electrically connected to ground.

Figure 5:
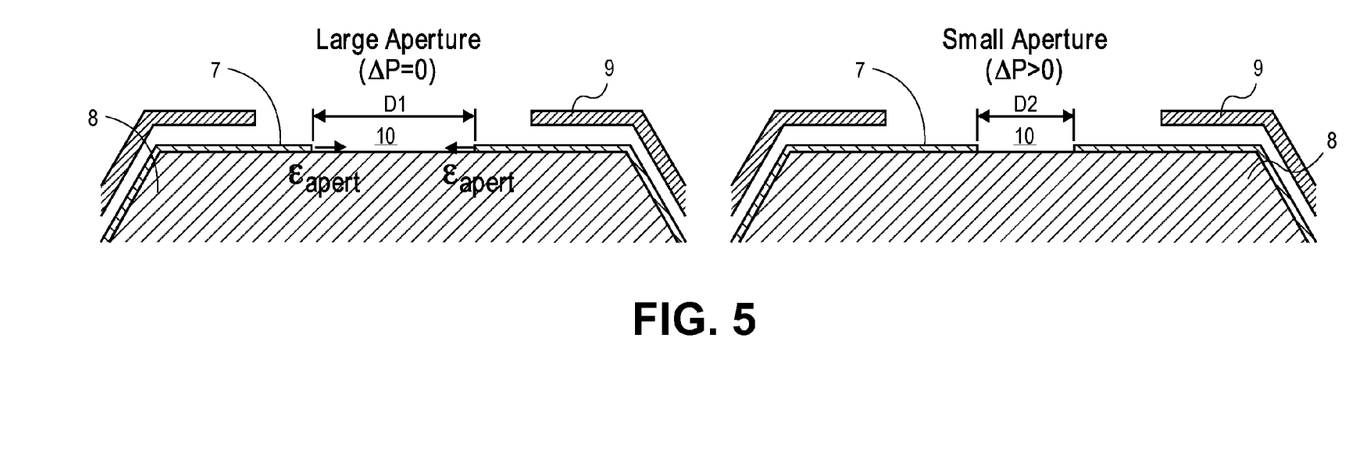
FIG. 5 shows cutaway views of the example actuator in small and large aperture states.

Turning now to FIG. 5, these cutaway views show how large and small apertures can be achieved, in one example. A large aperture diameter D1 is defined when the potential difference ΔP on the aperture electrode segment 14c, relative to the negative electrode 16, is small (e.g., ΔP=0). When ΔP is increased sufficiently, a resulting strain is produced in the tip region of the frusto-conical muscle structure 7, which reduces the opening 10 in size, to a smaller diameter D2.

Figure 6:
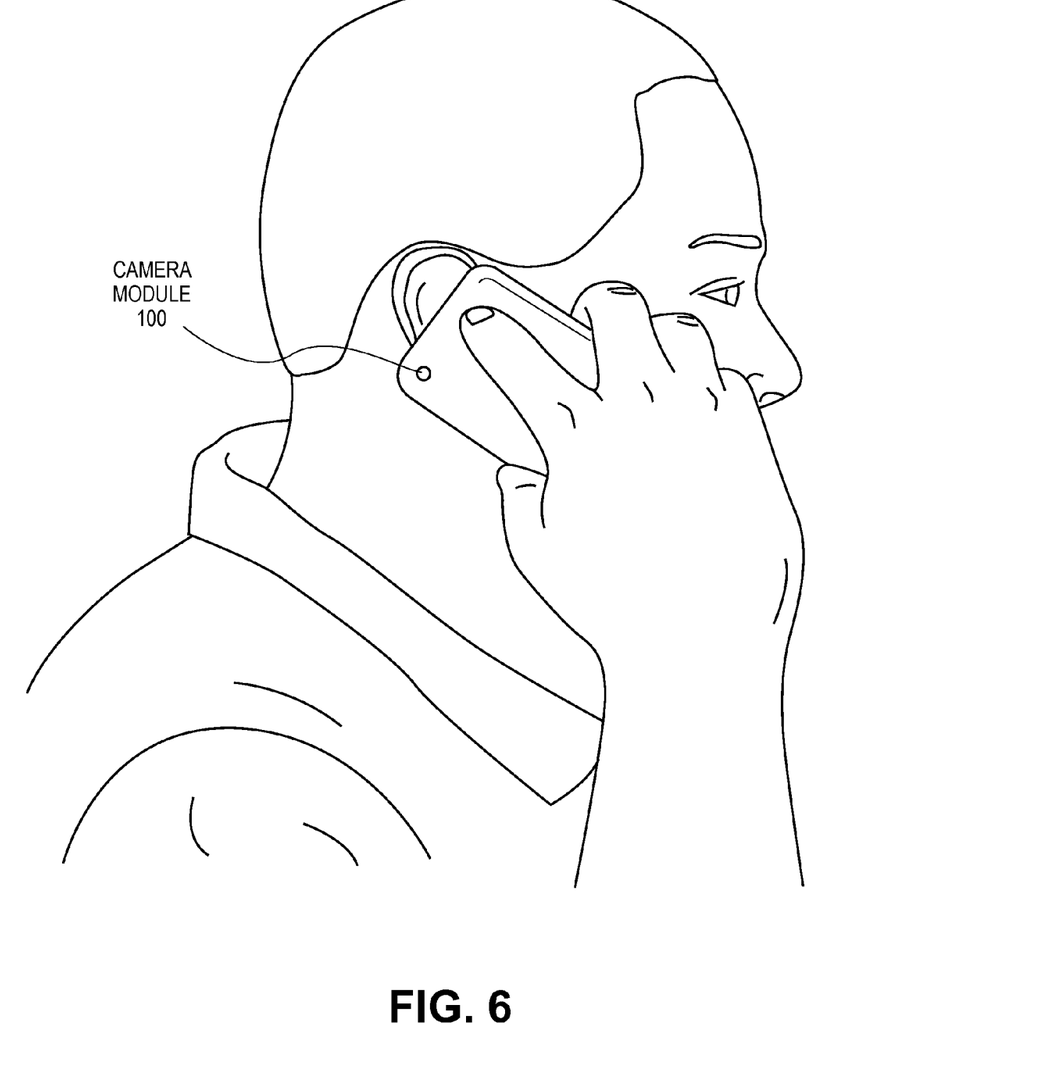
FIG. 6 depicts a portable consumer electronics device in which a camera module having the artificial muscle based actuator is integrated.

FIG. 6 is an example mobile phone device that is in use, and in which a camera module 100 containing an EAP actuator as described above has been integrated. The camera module 100 has been integrated, in this case into the back panel of a short profile or small thickness, communications handset housing (that is being held in the user's hand). The housing contains a rechargeable battery as the main power supply and conventional electronics as found in a typical mobile phone, e.g. a touchscreen that can be operated by its user in a camera viewfinder mode, and a cellular network baseband processor that enables cellular phone calls. Other host devices that can benefit from having the camera module integrated therein include a tablet computer and a laptop computer.

For purposes of explanation, specific embodiments were described to provide a thorough understanding of the invention. These should not be construed as limiting the scope of the invention but merely as illustrating different examples and aspects of the invention. It should be appreciated that the scope of the invention includes other embodiments not discussed in detail above. Various other modifications, changes, and variations which will be apparent to those skilled in the art may be made in the arrangement, operation, and details of the systems and methods of the present invention disclosed herein without departing from the spirit and scope of the invention as defined in the appended claims. Therefore, the scope of the invention should be determined by the claims and their legal equivalents.

What is claimed is:

1. A camera lens actuator, comprising:
   an imaging lens holder to which an imaging lens is secured, wherein light from a scene is to enter from a front of the lens and be incident upon an imaging sensor that is behind the lens;
   a base frame; and
   an electro-active polymer, EAP, structure having a generally frusto-conical shape and being secured at its base to the base frame and whose tip has an opening formed therein, the EAP structure being attached to the lens holder so that the opening in the tip is aligned with a face of the lens and the tip is in front of the lens, the EAP structure having a first electrode portion attached to a face of an EAP layer and extending in a longitudinal direction along a side of the EAP structure and a second electrode portion isolated from the first electrode portion and attached to the face of the EAP layer along the tip, the second electrode portion having an opening that is aligned with the opening in the EAP structure.

2. The camera lens actuator of claim 1 in combination with separate driver circuits that are coupled to drive the first and second electrode portions, wherein lens holder displacement is set primarily by the first driver circuit driving the first electrode portion, and aperture size is set primarily by the second driver circuit driving the second electrode portion.

3. The camera lens actuator of claim 1 further comprising a complementary electrode attached to an opposite face of the EAP layer and extending from the base to the tip, wherein there is a first voltage between the complementary electrode and the first electrode portion, and a second voltage between the complementary electrode and the second electrode portion that is different than the first voltage.

4. The camera lens actuator of claim 3 wherein the complementary electrode is attached to a front face of the EAP layer while the first and second electrode portions are attached to a rear face of the EAP layer, wherein the imaging lens lies behind the first and second electrode portions.

5. The camera lens actuator of claim 4 wherein the EAP structure comprises a third electrode portion being attached to the face of the EAP layer, wherein the second electrode portion is positioned in a gap between the first and third electrode portions and is electrically isolated therefrom.

6. The camera lens actuator of claim 5 wherein the first and third electrode portions are connected to be driven by the same driver circuit, while the second electrode portion is connected to be driven by a separate driver circuit.

7. The camera lens actuator of claim 1 further comprising a spring loading mechanism coupled between the base frame and the lens holder.

8. The camera lens actuator of claim 7 wherein the EAP structure is formed to be in a pre-tensioned state that exerts a force against the spring loading mechanism when the first electrode portion is not being driven, and wherein the EAP structure is released from its pre-tensioned state when the first electrode portion is being driven.

9. The camera lens actuator of claim 1 further comprising the imaging sensor positioned behind the lens to receive the light from the scene that is in front of the lens.

10. A camera lens actuator comprising:
   an imaging lens holder to which an imaging lens is secured, wherein light from a scene is to enter from a front of the lens and then pass through and be incident upon an imaging sensor that is behind the lens;
   a base frame; and
   an EAP structure having a base, a tip, and a side that extends from the base to the tip, the base being secured to the base frame while the tip and the side are attached to the lens holder with the tip positioned in front of the lens, the EAP structure having a first electrode portion and a second electrode portion both being attached to a face of an EAP layer while a complementary electrode portion is attached to an opposite face of the EAP layer, the first electrode portion to receive a first drive voltage relative to the complementary electrode, simultaneously with the second electrode portion receiving a second drive voltage, relative to the complementary electrode, that is different than the first drive voltage.

11. The camera lens actuator of claim 10 wherein the EAP structure is to a) move the lens holder primarily in response to the first drive voltage received on the first electrode portion, and b) change a size of an aperture of an imaging path through the lens primarily in response to the second drive voltage on the second electrode portion.

12. The camera lens actuator of claim 10 in combination with separate driver circuits that are coupled to drive the first and second electrode portions, wherein lens holder displacement is set primarily by the first driver circuit driving the first electrode portion, and aperture size is set primarily by the second driver circuit driving the second electrode portion.

13. The camera lens actuator of claim 10 wherein the complementary electrode and the first electrode portion extend in the direction of an imaging axis of the lens holder along the side of the EAP structure, and the second electrode portion has an opening that is aligned with a face of the lens.

14. The camera lens actuator of claim 13 wherein the complementary electrode is attached to a front face of the EAP layer while the first and second electrode portions are attached to a rear face of the EAP layer, and wherein the imaging lens lies behind the first and second electrode portions.

15. The camera lens actuator of claim 10 wherein the EAP structure comprises a third electrode portion being attached to the face of the EAP layer, wherein the second electrode portion is positioned in a gap between the first and third electrode portions and is electrically isolated therefrom.

16. The camera lens actuator of claim 15 wherein the first and third electrode portions are connected to be driven by the same driver circuit, while the second electrode portion is connected to be driven by a separate driver circuit.

17. The camera lens actuator of claim 10 further comprising a spring loading mechanism coupled to spring load the lens holder against the base frame.

18. The camera lens actuator of claim 17 wherein the EAP structure is formed to be in a pre-tensioned state that exerts a force against the spring loading mechanism when the first electrode portion is not being driven, and wherein the EAP structure is released from its pre-tensioned state when the first electrode portion is being driven.

* * * * *